United States Patent [19]
Fonash et al.

[11] Patent Number: 5,624,873
[45] Date of Patent: Apr. 29, 1997

[54] ENHANCED CRYSTALLIZATION OF AMORPHOUS FILMS

[75] Inventors: Stephen J. Fonash; Aiguo Yin, both of State College, Pa.

[73] Assignee: The Penn State Research Foundation, University Park, Pa.

[21] Appl. No.: 412,606

[22] Filed: Mar. 29, 1995

Related U.S. Application Data

[63] Continuation of Ser. No. 221,729, Apr. 1, 1994, abandoned, which is a continuation-in-part of Ser. No. 151,083, Nov. 12, 1993, abandoned.

[51] Int. Cl.⁶ .......................... H01L 21/26; H01L 21/324
[52] U.S. Cl. ............................................. 438/487; 438/764
[58] Field of Search .......................... 437/21, 101, 937, 437/233, 247, 967; 148/DIG. 22; 427/578, 255.1, 248.1; 257/66

[56] References Cited

U.S. PATENT DOCUMENTS

| | | | |
|---|---|---|---|
| 4,151,058 | 4/1979 | Kaplan et al. | 437/101 |
| 4,727,044 | 2/1988 | Yamazaki | 437/101 |
| 5,147,826 | 9/1992 | Liu et al. | 437/233 |
| 5,246,886 | 9/1993 | Sakai et al. | 437/228 |
| 5,254,484 | 10/1993 | Hefner et al. | 437/24 |
| 5,275,851 | 1/1994 | Fonash et al. | 427/578 |
| 5,288,658 | 2/1994 | Ishihara | 437/101 |
| 5,387,542 | 2/1995 | Yamamoto et al. | 437/101 |
| 5,403,772 | 4/1995 | Zhang et al. | 437/101 |

FOREIGN PATENT DOCUMENTS

| | | | |
|---|---|---|---|
| 0015677 | 9/1980 | Japan | 437/21 |
| 57-102027 | 6/1982 | Japan | 437/937 |
| 62-31111 | 2/1987 | Japan | 437/101 |
| 62-76514A | 4/1987 | Japan . | |
| 3-139824 | 6/1991 | Japan . | |
| 3-250728A | 11/1991 | Japan . | |
| 4-252018 | 9/1992 | Japan | 437/937 |
| 4-372118 | 12/1992 | Japan | 437/937 |
| 6-120152 | 4/1994 | Japan | 437/937 |
| 6-267861 | 9/1994 | Japan | 437/937 |
| 9310555 | 5/1993 | WIPO . | |

OTHER PUBLICATIONS

Gat et al. "Annealing of Ion–Implanted Si Using A Scanned CW Laser System", Radiation Effects, 1980, vol. 48, pp. 195–202 1980.

"Examination of the Optimization of Thin Film Transistor Passivation with Hydrogen Electron Cyclotron Resonance Plasmas", R.A. Ditzio et al., J. Vac. Sci. Tech. A 10(1), Jan./Feb. 1992, pp. 59–65.

"Low–Temperature Polycrystalline–Silicon TFT on 7059 Glass", W. Czubatyj et al., IEEE Electron Device Letters, vol. 10, No. 8, Aug. 1989, pp. 349–351.

"Low Thermal Budget Poly–Si Thin Film Transistors on Glass", G. Liu, vol. 30, No. 2B, Feb. 1991, pp. L269–L271.

Primary Examiner—Mary Wilczewski
Attorney, Agent, or Firm—Thomas J. Monahan

[57] ABSTRACT

A fabrication process for rendering, for example, amorphous silicon (a-Si) films into polycrystalline silicon (poly-Si) films initially commences with the deposition of the a-Si film on a substrate such as glass. The a-Si film is then exposed to a particle flux (e.g. a plasma or a neutral beam). The resulting treatment apparently causes an action that enhances a subsequent crystallization process. The treatment occurs at a temperature well below any level which causes a change in the substrate. The particle flux treatment is followed by an anneal step that enables a rapid crystallization. By appropriate masking prior to the treatment, crystallization in non-treated areas is prevented while crystallization in treated areas occurs during the anneal procedure.

21 Claims, 6 Drawing Sheets

ENHANCED CRYSTALLIZATION OF AMORPHOUS FILMS

This is a continuation of application Ser. No. 08/221,729, filed on Apr. 1, 1994, abandoned, which is a continuation-in-part of application Ser. No. 08/151,083, filed on Nov. 12, 1993, abandoned.

This invention relates to a method for crystallization of amorphous films into large grain polycrystalline films and, more particularly, to a method for achieving selective crystallization of such films.

BACKGROUND OF THE INVENTION

Polycrystalline silicon thin film transistors have the potential for extensive applications in large area electronic devices such as flat panel displays, detect, or arrays and image sensors. Recently, studies of polysilicon (poly-Si) thin film transistors have concentrated on methods for reducing their fabrication costs, either by reducing the transistors' processing time or by lowering the processing temperatures. The latter effect is important since it allows the usage of less expensive substrates for the transistor arrays, e.g., glass, plastic, etc. . . For instance, Czubatyj et al. in "Low-Temperature Polycrystalline TFT on 7057 Glass", IEEE Electron Device Letters, Vol. 10, pages 349–351, 1989, demonstrates that polysilicon thin film transistors can be fabricated on 7059 glass substrates using relatively low temperature furnace annealing for crystallization. However, the crystallization process takes longer than 75 hours and is therefore not practically applicable.

Poly-Si films can be deposited, deposited recrystallized, or deposited in the amorphous (a-Si) form and then crystallized into poly-Si films. In the latter approach, the crystallization of the a-Si into poly-Si includes two steps: solid-phase nucleation and grain growth. The grain growth process continues until two growing grains impede each other. Since a nucleation process has a higher thermal activation energy than grain growth, a lower temperature crystallization with fewer nucleating sites (which usually take a longer time create) is needed to obtain a larger grain-size polycrystalline silicon.

There are three principal crystallization processes: furnace annealing, rapid thermal process (RTP) and laser annealing. Although reported laser annealing techniques have the potential for low temperature crystallization, laser crystallization suffers from the need to raster the laser beam; raising throughput issues. Laser annealing also exhibits other difficulties, e.g. reproducibility, uniformity and peel-off. The most commonly used methods for producing large grain poly-Si films are furnace annealing of a-Si films at temperatures>=600 ° C., with very long processing times (16–30 hours or longer for a-Si films) or the RTP approach (e.g. 700° C./5 mins).

An inventor hereof in "Low Thermal Budget Poly-Silicon Thin Film Transistors on Glass", Japanese Journal of Applied Physics, Vol. 30, pages L269–L271, 1991 has demonstrated that thin film transistors can be fabricated on poly-Si films made by the crystallization of precursor a-Si films. Those polycrystalline films were obtained by a rapid thermal annealing of the precursor films for five minutes at 700° C. on 7059 glass substrates.

In U.S. Pat. No. 5,147,826 to Liu et al., it is shown that a prior art thermal anneal procedure at 700° C. (for converting a-Si to poly-Si) can be reduced to a range of from 550° C. to 650° C. This improvement is accomplished by depositing a thin discontinuous film of a nucleating site forming material over an already deposited layer of a-Si. The two contiguous films are then rapidly thermally annealed, with the nucleating site forming material enabling crystallization of the underlying a-Si at temperatures lower than theretofore reported.

Liu et al. also report in the '826 patent that a-Si can be selectively crystallized by depositing the nucleating site performing material in a pattern thereon and subsequently subjecting the patternized surface to an anneal procedure. Because the nucleating site forming material is a metal, the treated surface of the subsequently crystallized silicon is not optimal for structures. As a result, additional processing steps are required to allow untreated surfaces to become boundaries for devices to be grown.

In U.S. Pat. No. 5,275,851 of Fonash et al., a fabrication process for polycrystalline silicon thin film transistors is described that commences with a deposition of an ultra-thin nucleating-site forming layer onto the surface of an insulating substrate (e.g., 7059 glass, plastic). Next, an a-Si film is deposited thereover and the combined films are annealed at temperatures that do not exceed 600° C. By patterning the deposition of the nucleating site forming material on the glass substrate, the subsequently deposited a-Si film can be selectively crystallized only in areas in contact with the nucleating-site forming material.

Accordingly, it is an object of this invention to provide an improved low temperature crystallization procedure for an amorphous semiconductor film.

It is a further object of this invention to provide an improved method for enabling selective crystallization of an amorphous semiconductor film.

It is another object of this invention to provide an improved method for crystallization of an amorphous semiconductor film, including an a-Si film, wherein processing parameters are such as to enable the film to be processed while in place on a glass, silicon or other inexpensive substrates.

SUMMARY OF THE INVENTION

A fabrication process for rendering, for example, amorphous silicon (a-Si) films into polycrystalline silicon (poly-Si) films initially commences with the deposition of the a-Si film on a substrate such as glass. The a-Si film is then exposed to a particle flux (e.g. a plasma or a neutral beam). The resulting treatment apparently causes an action that enhances a subsequent crystallization process. The treatment occurs at a temperature well below any level which causes a change in the substrate. The particle flux treatment is followed by an anneal step that enables a rapid crystallization. By appropriate masking prior to the treatment, crystallization in non-treated areas is prevented while crystallization in treated areas occurs during the anneal procedure.

DETAILED DESCRIPTION OF THE INVENTION

The invention requires a source of high flux, low energy particles to bombard an amorphous semiconductor film. The energy level of the particle flux should be below the sputtering threshold of the semiconductor film. The constituents of the particle flux should not adversely chemically react with the semiconductor film or etch the film. The particle flux should cause a combination of void formation, broken amorphous semiconductor bonds, or extra "interstitial" semiconductor atom production in a thin surface layer of the semiconductor film. Sources of high flux, low energy particles include high density plasma sources such as electron cyclotron resonance (ECR) plasmas, neutral beam sources and low energy ion sources. Paragraphs A and B below give examples of specific particle flux treatments that enable a significant reduction in a thermal budget required to accomplish crystallization of an amorphous semiconductor film.

A) Oxygen, Argon Plasma Enhanced Crystallization

A lower thermal-budget crystallization process for hydrogenated, amorphous silicon (a-Si:H) films has been developed that demonstrates that application of a plasma treatment to the a-Si:H film enables a subsequent crystallization of the film in a substantially shorter time than heretofore. 1500 and 1000 Angstrom a-Si:H films were grown on glass using a plasma-enhanced chemical vapor deposition (PECVD) process. The resulting a-Si:H films were exposed to an electron cyclotron resonance (ECR) oxygen or argon plasma for a range of times, with the sample heated to a range of temperatures. Such times and temperatures are sufficiently modest that the substrate was not affected. The plasma-exposed films were then crystallized by either a furnace thermal anneal procedure or a rapid thermal anneal (RTA) procedure.

Using a particle flux treatment, the time/temperature thermal budget can be substantially reduced to accomplish subsequent crystallization of a semiconductor amorphous film. The reduced requirements are manifest in a (i) reduced temperature needed for a fixed time, in a (ii) reduced time needed for fixed temperature, or some combination of (i) and (ii) to accomplish the crystallization action.

Compared, for example, to control samples without the plasma treatment, the crystallization time for the plasma-treated samples was found to be: reduced from 16 hours to 6 hours for a 600° C. furnace anneal; or, in the case of RTA, the crystallization temperature was reduced from 680° C. to 650° C. (for a five minute anneal). These reductions in furnace anneal time and in RTA temperature (from 680° C. to 650° C.) can make the difference between using or not using an inexpensive glass substrate for the support of the poly-Si films. That is critical if such poly-Si is to be used to produce thin film transistors-on-glass for displays.

It has been further found that the above described plasma-enhanced crystallization of a-Si:H films into poly-Si can be achieved selectively. This is accomplished by masking the a-Si film during plasma exposure. The result is that regions masked from the plasma remain amorphous during a subsequent anneal action. Thin film transistors have been fabricated using this process.

In brief therefore, it has been determined that plasma exposure successfully enhances crystallization of a-Si films. The plasma treatment not only reduces the crystallization time dramatically, but also enables polysilicon grain size enhancement. Polysilicon thin films transistors have been fabricated on 7059 glass with mobility values of 35 $cm^2/Vs$ and threshold voltages of 0.5 V. The thermal budget to crystallize a 1500 Angstrom PECVD a-Si:H film was reduced from 600° C. for 14 hours to 600° C. for 5 hours using furnace annealing or reduced from 680° C. for 5 minutes to 650° C. for 5 minutes using RTA anneal procedures.

B) Hydrogen, Helium Plasma-Enhanced Crystallization

It has been found that a reduced crystallization thermal budget for a-Si:H is present if a high density plasma source helium or hydrogen plasma exposure is used instead of oxygen or argon plasma exposure treatments reported above.

For instance, a 1000 A a-Si:H film on a glass substrate (i.e. "example 1") and a 1500 A a-Si:H film on a glass substrate coated with silicon nitride ("example 2") were both exposed to helium and hydrogen plasmas and subsequently annealed. The crystallization thermal budget of example 1 was reduced from 575° C./16 hours to 575° C./10 hours and for example 2 from 600° C./32 hours to 600° C./6 hours.

Experimental

A Plasma Enhanced Crystallization of a-Si Films

Hydrogenated amorphous silicon was deposited by PECVD on 7059 glass or on $Si_3 N_4$ coated 7059 glass substrates at a deposition temperature of 215° C. or 250° C. The thicknesses of the amorphous silicon films were either 1000 or 1500 Angstroms. After deposition, sets of samples were cut from the substrate and divided into four groups (i.e. groups 1–4). Samples from each group served as controls (i.e., were not subjected to any plasma treatment prior to thermal crystallization). Samples in group 1 were 1500 A a-Si:H films deposited at 250° C. on glass. These were exposed to an oxygen plasma in an ECR reactor. A 60 minute ECR oxygen plasma treatment was used with microwave power set at 700 watts, oxygen pressure at $4 \times 10^{-4}$ Torr and a substrate temperature of 400° C. (The plasma parameters are exemplary). The above identified procedures were repeated using an ECR argon plasma treatment. All other parameters remained the same. Samples in group 2 were 1000 A a-Si:H on glass, deposited at 215° C. These were exposed to the same ECR $O_2$ plasma.

Those samples used as controls and those samples exposed to ECR oxygen plasma were then crystallized by furnace annealing at 600° (group 1) or at 575° C. (group 2) for times ranging from 2 hours to 20 hours in an $N_2$ ambient or by rapid thermal annealing (RTA) (group 1) for 5 minutes at temperatures ranging from 600° C. to 700° C. in an Argon ambient. A Heat pulse 210 rapid thermal processing system was used for the RTA annealing.

Group 3 samples (1000 A a-Si:H deposited at 215° C. on glass) were exposed to He or H plasmas, all with 700 watts power, 60 minute exposures and substrate temperatures of 400° C. After the ECR plasmas exposure, the samples were furnace annealed at 575° C. for various times. Group 4 samples (1500 A a-Si:H deposited at 250° C. on $Si_3Ni_4$ coated glass) were exposed to He, $O_2$ or H ECR plasmas (700 watts, 400° C., 60 minutes exposures). Subsequently these were furnace annealed at 600° C. for various times.

X-ray photoelectron spectroscopy (XPS) was used to analyze the film surfaces of both ECR oxygen plasma exposed and non-exposed samples. UV reflectance measurements were taken on all samples to monitor the conventional crystallization process and the plasma enhanced crystallization process. Transmission electron microscope (TEM) examination was also used to characterize the polysilicon films obtained from the different crystallization processes.

Note that while the a-Si was deposited using a PECVD process, it could also be chemically or sputter deposited. Further while $N_2$ and Ar ambients were used, other ambients are also acceptable e.g., Oxygen.

RESULTS

Figure 1:
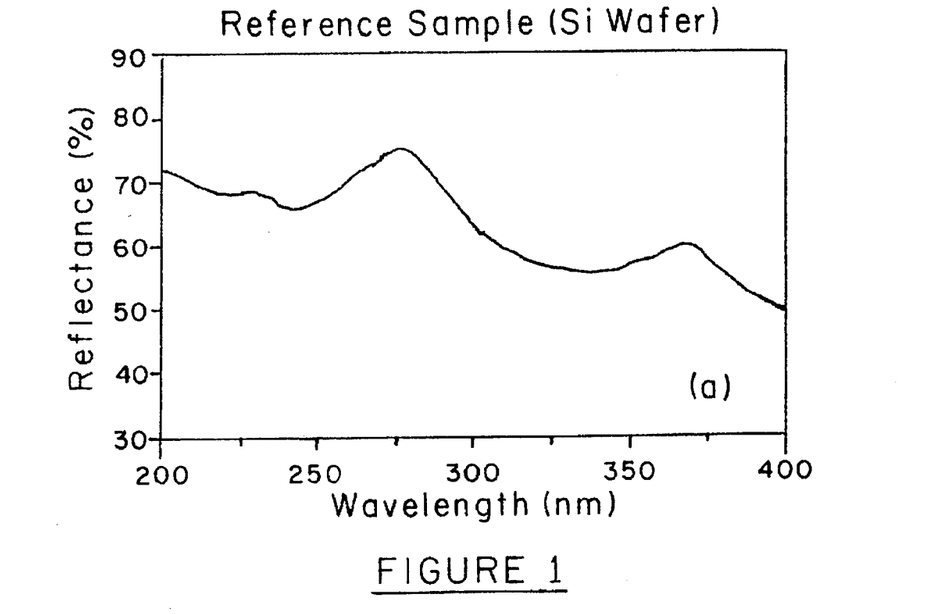
FIG. 1 is a plot of UV reflectance spectra, plotted against wavelength, for a reference silicon wafer sample.
Figure 2:
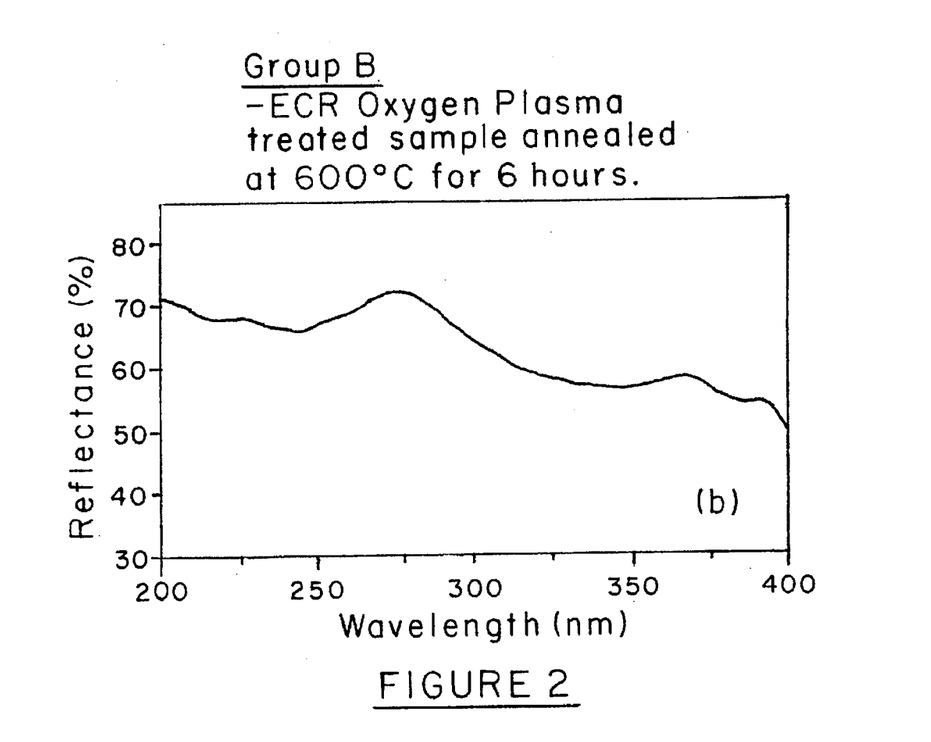
FIG. 2 is a plot of UV reflectance spectra, plotted against wavelength, for an electron cyclotron resonance (ECR) oxygen plasma treated sample, after furnace annealing at 600° C. for six hours.
Figure 3:
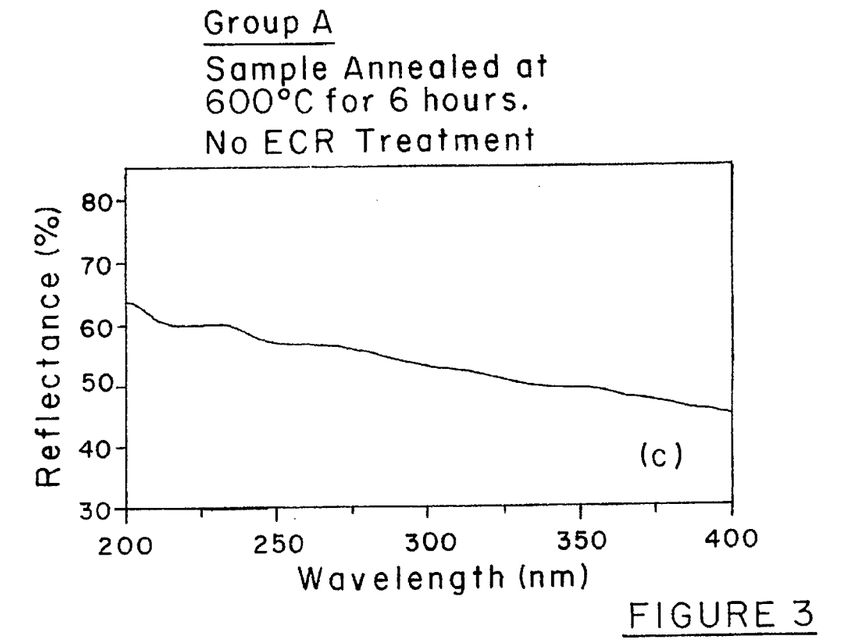
FIG. 3 is a plot of UV reflectance spectra, plotted against wavelength, for a control sample of a-Si after furnace annealing at 600° C. for six hours, which control sample has not been subjected to a plasma treatment.

UV reflectance spectra of a sample from group 1 that received an ECR oxygen plasma treatment prior to 6 hours annealing at 600° C. (FIG. 2) is compared to that of a sample which received the same furnace annealing but without the plasma treatment (FIG. 3). As a reference, a UV reflectance spectrum of a Si wafer is also shown (see FIG. 1). The single crystal spectrum (FIG. 1) shows two reflectance peaks at 276 nm and 365 nm which are due to optical transitions at the X point and along the Γ-L axis of the Brillouin zone. As shown in FIG. 2, these characteristic reflectance peaks for crystalline material are also observed in the group 1 sample. This indicates that ECR oxygen plasma enhanced crystallization has occurred for the 600° C./6 hour anneal. In FIG. 3, no reflectance peak is discernible for the control sample which did not have the ECR oxygen plasma exposure but which did have the same 600° C./6 hour anneal. All companion sets in the study were annealed together.

Through the use of UV reflectance to monitor crystallization, it has seen that a UV reflectance peak at around 276 nm (4.5 eV) first appears as the a-Si precursor film begins to crystallize. This peak increases during grain growth and saturates when the crystallization is completed. For an evaluation of the ECR oxygen plasma enhanced crystallization, a reflectance peak height (ΔR) was defined as the difference from the minimum reflectance seen at around 240 nm to the maximum reflectance seen at around 276 nm in FIG. 2. This peak height was used to monitor the crystallization process and to determine the crystallization's thermal budget.

Figure 4A:
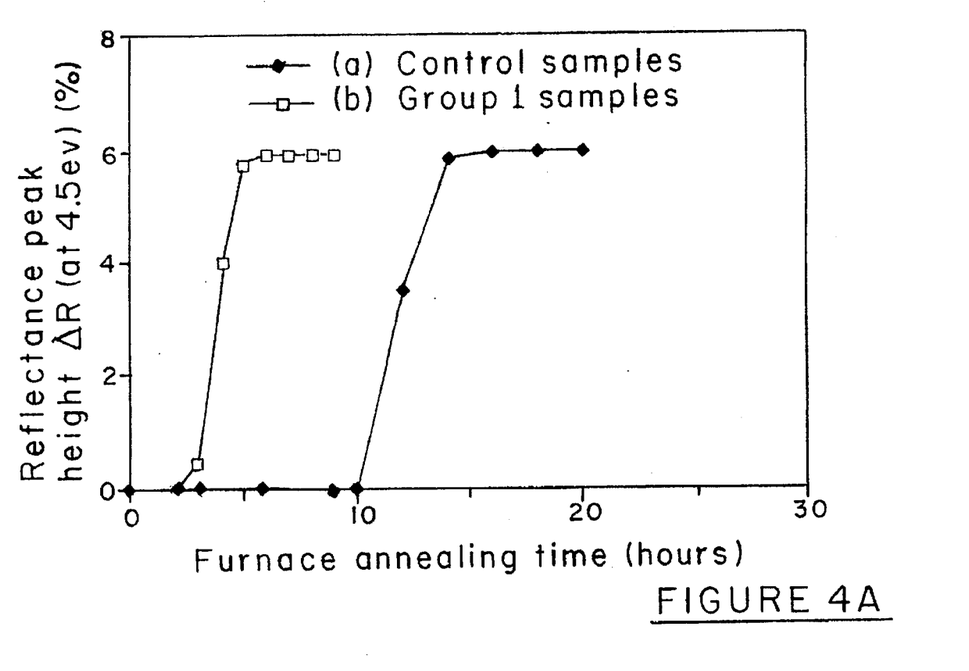
FIGS. 4a–4c are plots of UV reflectance peak height ($\Delta R$) at 276 nm (4.5 ev) as a function of furnace annealing time for both control samples and ECR plasma exposed samples.
Figure 4B:
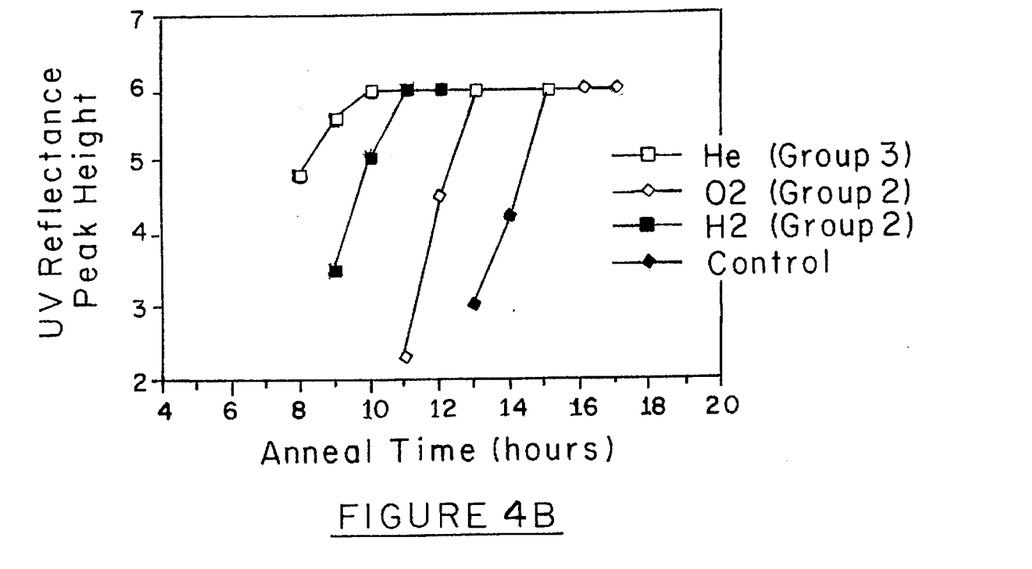

In FIG. 4a, the peak heights ΔR at 276 nm of control samples for group 1 (without ECR oxygen plasma treatment) and group 1 ECR oxygen plasma-treated samples are plotted as a function of annealing time, for a 600° C. furnace anneal. Both control samples (plot (a)) and ECR oxygen plasma treated samples (plot (b)) demonstrate that the reflectance peak height will saturate when complete crystallization is reached. With 600° C. furnace annealing alone, group 1 control samples needed 14 hours to become polycrystalline, while group 1 ECR oxygen plasma exposed samples needed only 5 hours. FIG. 4b shows the corresponding data for group 2 films exposed to the $O_2$ ECR treatment and their controls annealed at 575° C.

Figure 5:
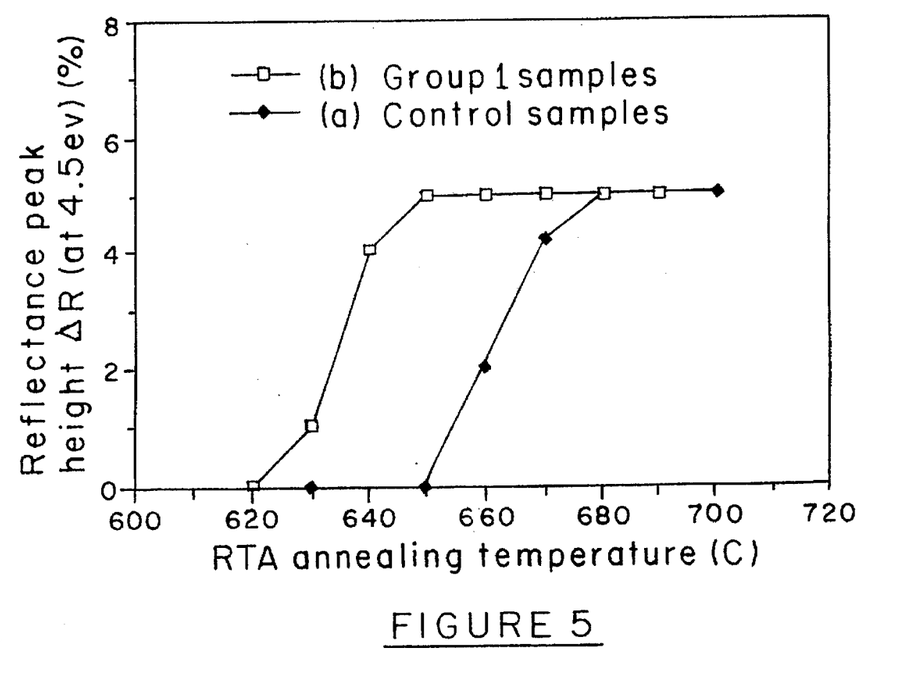
FIG. 5 is a plot of UV reflectance peak height (ΔR) at 276 nm (4.5 ev) as a function of a 5 minute rapid thermal anneal temperature for both control samples and ECR oxygen plasma exposed samples.

For five minute RTA annealing, the peak heights at 276 nm of both control samples and ECR oxygen plasma treated samples are measured as a function of anneal temperature. As shown in FIG. 5, a 680° C./5 minute thermal budget is required to obtain polycrystalline silicon from control samples for group 1 (i.e. without the ECR oxygen plasma treatment), while a lower thermal budget of 650° C./5 minute suffices for the ECR oxygen plasma exposed group 1 samples.

In general, the process of crystallization for a-Si precursor films includes two steps: nucleation and grain growth. The grain growth ceases when surrounding grains restrict further growth. Either grain nuclei enrichment or grain growth enhancement can speed the crystallization process. The first will cause smaller grains while the second process produces larger grains. Larger polycrystalline grain sizes were obtained for the ECR oxygen plasma-treated films even after only 6 hours annealing at 600° C. To further demonstrate that ECR oxygen plasma processed a-Si:H film can be crystallized at low temperatures, a 575° C./16 hour furnace anneal was used to obtain a high quality polycrystalline silicon. After a 575° C./16 hour furnace anneal, the maximum grain size of an ECR plasma processed silicon film was as large as 2 μm while the control sample without ECR plasma exposure remained amorphous.

Figure 4C:
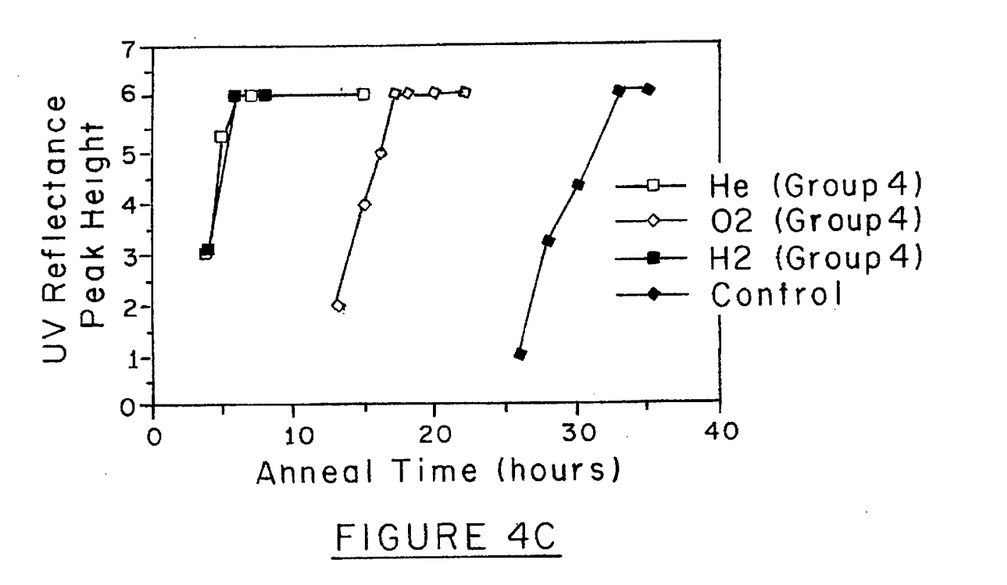

In the case of He and $H_2$ plasma exposures, it was found that, compared to control samples without any plasma treatment, the ECR helium or hydrogen plasma exposure reduced the crystallization thermal budget of group 3 a-Si films from 575° C./16 hours to 575° C./10 hours as shown in FIG. 4b and of a group 4 a-Si film from 600° C./32 hours to 600° C./6 hours as shown in FIG. 4c. By contrast, the oxygen and argon plasma results were less advantageous and reduced the crystallization thermal budget of a group 2 a-Si film from 575° C./16 hours to 575° C./13 hours (FIG. 4b) and of a group 4 a-Si film from 600° C./32 hours to 600° C./15 hours (FIG. 4c).

Table 1 below summarizes the thermal budget results for both glass and $Si_3N_4$ coated glass substrates:

(a) Example 1 films: 1000 A a-Si/glass, annealed at 575° C.

| Samples | control | with oxygen plasma treatment | with helium plasma treatment | with hydrogen plasma treatment |
|---|---|---|---|---|
| crystallization time (hour) | 16 | 13 | 10 | 10 |

(a) Example 2 films: 1500 A a-Si/glass, annealed at 600° C.

| Samples | control | with oxygen plasma treatment | with helium plasma treatment | with hydrogen plasma treatment |
|---|---|---|---|---|
| crystallization time (hour) | 32 | 15 | 6 | 6 |

Table 1 Comparison of crystallization thermal budget of PECVD a-Si:H films with or without plasma treatment (plasma exposure conation: P=700 W, t=60 min., T=400 C)

As can be seen from Table 1, ECR helium plasma or hydrogen plasma exposures can produce a much greater crystallization enhancement of a-Si:H than ECR oxygen plasma exposure.

Figure 6:
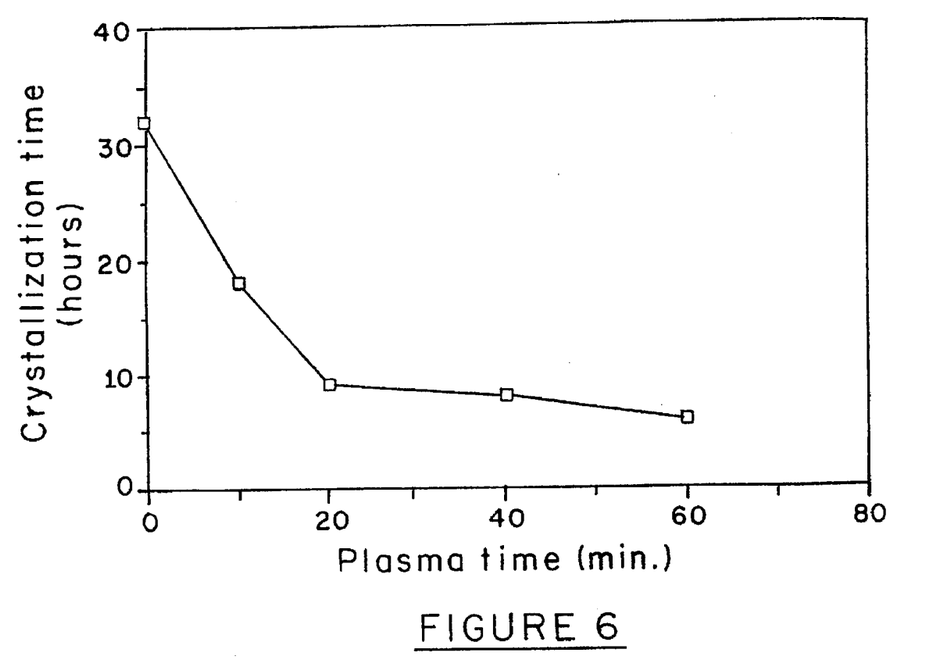
FIG. 6 is a plot of evolution of crystallization time of films as a function of plasma exposure time.
Figure 7:
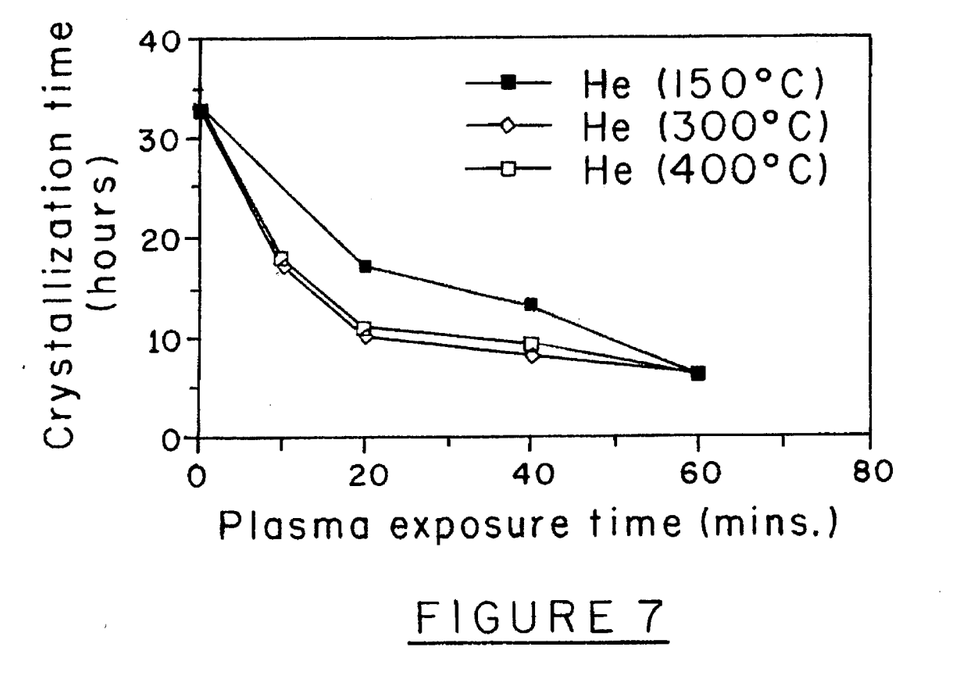
FIG. 7 is a plot of evolution of crystallization time as a function of the plasma exposure time and temperature.

It has also been found that ECR helium plasma exposure of a-Si:H, without substrate heating, can produce the same crystallization enhancement as that with 400° C. substrate heating. This means that the crystallization thermal budget after helium plasma exposure can be reduced from 600° C./32 hours to 600° C./6 hours without prior substrate heating. In FIG. 6, the relation is plotted between helium plasma exposure time and the time required for crystallization of exposed 1500 Å a:Si:H on $Si_3N_4$ coated glass. The plasma condition was: power=700 W and temperature=300° C. It is seen that a short 20 minute ECR helium plasma exposure can dramatically reduce the crystallization thermal budget of these a-Si:H films from 600° C./32 hours to 600° C./10 hours. The fact that this effect can occur for low temperatures during the He plasma exposure is seen in FIG. 7.

(B) Fabrication and Characteristics of Thin Film Transistors

Figure 8:
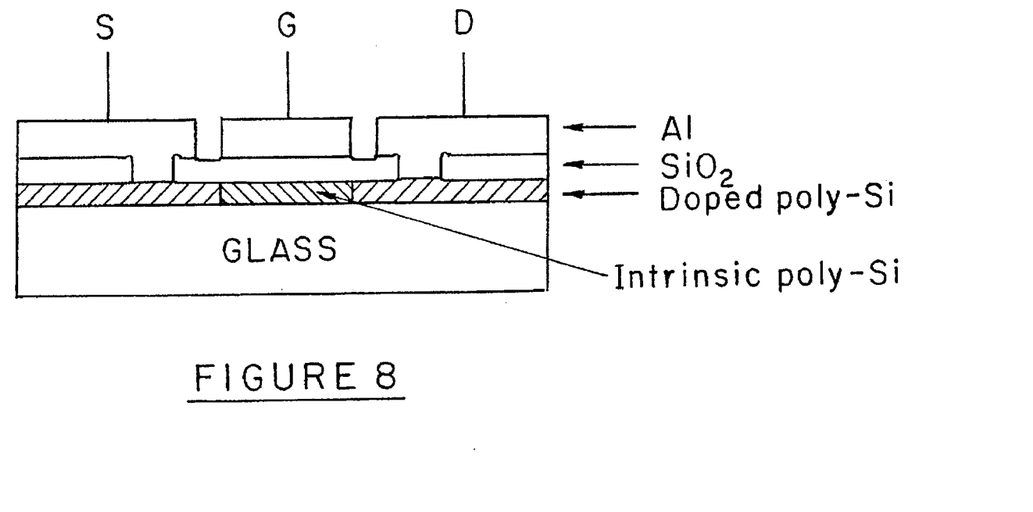
FIG. 8 is a cross sectional view of a thin film transistor fabricated employing the process of the invention.

FIG. 8 shows the structure of TFTs used to evaluate the above-described poly-Si crystallization process. The particular ECR exposure used was $O_2$ ECR plasma. The channel length of the TFTs is 7.5 μm and the channel width is 75 μm. First, source and drain regions were defined and implanted with $2 \times 10^{15}$ $cm^{-2}$ phosphorous at 40 key. After implantation, the a-Si films were exposed to an oxygen plasma treatment and then crystallized by furnace annealing at 600° C. for 6 hours. A 1000 Angstrom $SiO_2$ layer was then deposited by magnetron sputtering for the gate dielectric. Finally, contact windows were opened by wet etching, and an 8000 Angstrom aluminum layer was thermally evaporated to form the source, drain and gate contacts. After the structure was completed, the TFTs were passivated using ECR hydrogen plasma for 8 minutes.

For comparison, control TFTs were also fabricated using the same process as described above, except that those TFTs were not exposed to oxygen plasma treatment and, instead, were crystallized using furnace annealing at 600° C. for 16 hours (10 hours longer than the oxygen plasma-based process).

RESULTS

Figure 9:
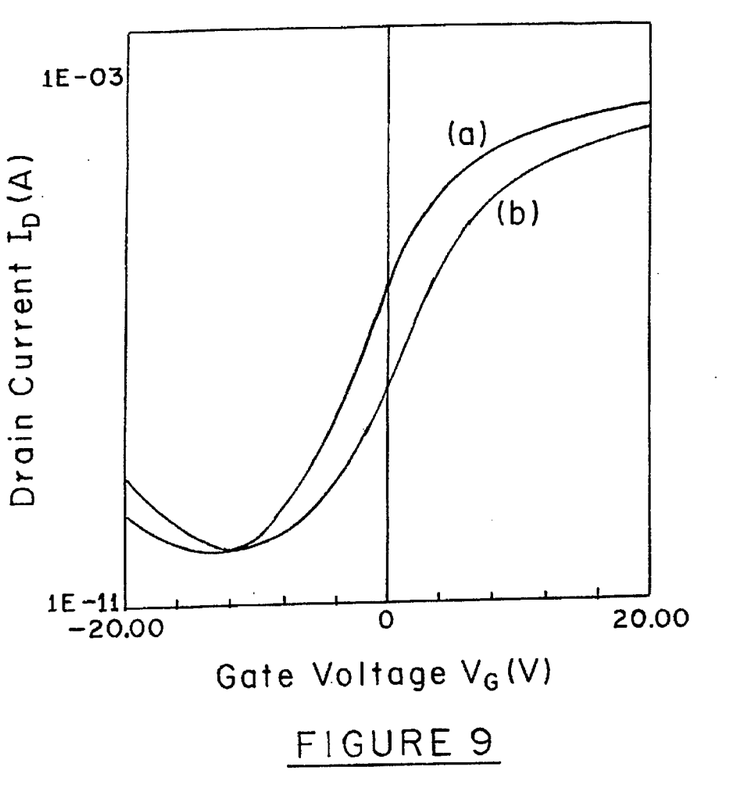
FIG. 9 is a plot of drain current versus gate voltage of polysilicon thin film transistors fabricated in accordance with the invention, wherein curve A represents thin film transistors with an oxygen plasma exposure, crystallized using six hours of anneal at 600° C. and curve B is a plot of thin film transistors without oxygen plasma exposure, but crystallized using a 16 hour anneal at 600° C.

The drain current ($I_D$) versus gate voltage ($V_G$) characteristics of TFTs fabricated using oxygen plasma enhanced crystallization technique (curve a) and control TFTs (curve b) are shown in FIG. 9. For a drain/source voltage $V_{DS}$ of 2 volts, the device characteristics of mobility, threshold voltage, on/off current ratio and inverse subthreshold slope are listed in Table 2 below.

| TFTs | μ($cm^2$/Vs) | VT(v) | on/off | S(v/dec) |
| --- | --- | --- | --- | --- |
| A | 35 | 0.5 | $4 \times 10^6$ | 1.9 |
| B | 20 | 3.8 | $2 \times 10^6$ | 2.1 |

Table 2. Performance comparison of TFT devices with (A) and without (B) oxygen plasma enhancement of crystallization).

In Table 2, mobility (μ) was calculated in the linear region at maximum transconductance; threshold voltage ($V_{th}$) was defined as the gate bias at which the normalized drain current $I_{dn}$ ($I_{dn}=I_d(L/W)$) equals $10^{-7}$ A; and the on/off current ratio was defined between the maximum forward current and the minimum off-current for a gate voltage ranging from −20 V to 20 V. As seen in Table 2, the TFT evaluation structures show that the ECR oxygen process of poly-Si material is superior. For the ECR plasma exposed material, the mobility was increased from 20 to 35 $cm^2$/V s and the threshold voltage was reduced from 3.8 to 0.5 V. There was no dramatic improvement in the subthreshold swing, but this would not be expected for evaluation structures which used a sputtered gate dielectric.

In order to explain the effects of the oxygen plasma treatment on TFT performance, transmission electron microscopy (TEM) was used to analyze polysilicon films from both plasma exposed and unexposed samples. The TEM images demonstrated that larger polysilicon grains (up to 2 μm) were obtained for the oxygen plasma exposed sample even with much shorter time thermal crystallization). The grain size enhancement is believed to be responsible for the higher effective mobility of the TFTs.

It should be understood that the foregoing description is only illustrative of the invention. Various alternatives and modifications can be devised by those skilled in the art without departing from the invention. For instance, while glass has been described as a preferred substrate, an appropriate plastic substrate is also acceptable. The method is applicable to other semiconducting materials, e.g., Ge, SiGe alloys etc.

What is claimed is:

1. A method exhibiting a reduced thermal budget for producing a polycrystalline film of a semiconducting material film on a substrate, comprising the steps of:
   (a) depositing an amorphous film of said semiconducting material on said substrate, said amorphous film having a thickness enabling fabrication of a semiconductor structure therein:
   (b) exposing said amorphous film to a particle flux to promote subsequent solid phase crystallization growth therein while maintaining said amorphous film below any melting point thereof, said particle flux bearing a constituent selected so as to not adversely react with or etch said amorphous film;
   (c) annealing said amorphous film for not more than about 10 hours to enable solid phase crystal growth therein; and
   (d) subsequently passivating said amorphous film.

2. The method of claim 1 wherein said semiconducting material is silicon.

3. The method of claim 1 wherein step (b) exposes said amorphous film to a particle flux from a plasma.

4. The method of claim 1 wherein said annealing step (c) is accomplished by placing said substrate and plasma-exposed amorphous film into a furnace at an elevated temperature.

5. The method of claim 1 wherein said annealing step (c) is accomplished by rapid thermal annealing through exposure of said film to intense radiative light energy.

6. The method of claim 1 wherein said annealing step (c) is accomplished by exposure of said film to a laser beam.

7. The method of claim 1 wherein said substrate is a glass plate.

8. The method of claim 1 wherein said substrate is a glass plate having a diffusion barrier coating.

9. The method of claim 1 wherein step (b) exposes said amorphous film to said particle flux while said film is at a temperature in a range from ambient to approximately 650° C., for a time not in excess of approximately two hours.

10. The method of claim 1, wherein said constituent is selected from at least one of: oxygen, hydrogen, argon and helium.

11. The method of claim 1, wherein said annealing step (c) occurs after exposing step (b) and after removal of said particle flux.

12. A method for producing a patterned polycrystalline film of a semiconducting material from an amorphous film of said semiconducting material that is resident on a substrate, said amorphous film having a thickness enabling fabrication therein of a semiconductor structure, said method comprising:

(a) masking portions of said amorphous film;

(b) exposing unmasked areas of said amorphous film to a particle flux to promote solid phase crystallization in unmasked areas while maintaining said amorphous film below any melting point thereof, said particle flux bearing a constituent selected so as to not adversely react with or etch said amorphous film;

(c) annealing said amorphous film for not more than about 10 hours to enable solid phase crystal growth therein; and (d) subsequently passivating said amorphous film.

13. The method of claim 12 wherein step (b) exposes said amorphous film to a particle flux from a plasma.

14. The method of claim 12 wherein said annealing step (c) is accomplished by placing said substrate and plasma-exposed amorphous film into a furnace at an elevated temperature.

15. The method of claim 12 wherein said annealing step (c) is accomplished by rapid thermal annealing through exposure of said film to intense radiative light energy.

16. The method of claim 12 wherein said annealing step (c) is accomplished by exposure of said film to a laser beam.

17. The method of claim 12 wherein said substrate is a glass plate.

18. The method of claim 12 wherein said substrate is a glass plate having a diffusion barrier coating.

19. The method of claim 12 wherein step (b) exposes said amorphous film to said particle flux while said film is at a temperature in a range from ambient to approximately 650° C., for a time not in excess of approximately two hours.

20. The method of claim 12, wherein said constituent is selected from at least one of: oxygen, hydrogen, argon and helium.

21. The method of claim 12, wherein said annealing step (c) occurs after exposing step (b) and after removal of said particle flux.

* * * * *